(12) United States Patent
Caracciolo

(10) Patent No.: US 9,857,815 B2
(45) Date of Patent: Jan. 2, 2018

(54) REGULATOR WITH ENHANCED SLEW RATE

(71) Applicant: SK hynix Inc., Gyeonggi-do (KR)

(72) Inventor: Herve' Caracciolo, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/167,619

(22) Filed: May 27, 2016

(65) Prior Publication Data

US 2016/0349777 A1 Dec. 1, 2016

(30) Foreign Application Priority Data

May 28, 2015 (IT) .................. 102015000018974

(51) Int. Cl.
| | | |
|---|---|---|
| *G05F 1/569* | (2006.01) | |
| *G05F 1/573* | (2006.01) | |
| *G05F 1/575* | (2006.01) | |
| *H03F 3/50* | (2006.01) | |
| *H03K 5/24* | (2006.01) | |
| *H03F 3/45* | (2006.01) | |

(52) U.S. Cl.
CPC .............. *G05F 1/573* (2013.01); *G05F 1/575* (2013.01); *H03F 3/45183* (2013.01); *H03F 3/505* (2013.01); *H03F 2200/69* (2013.01); *H03F 2203/45248* (2013.01); *H03K 5/24* (2013.01)

(58) Field of Classification Search
CPC .................................. G05F 1/575; G05F 1/56

USPC .................................................. 323/273–281
See application file for complete search history.

(56) References Cited

U.S. PATENT DOCUMENTS

| | | | |
|---|---|---|---|
| 7,199,565 B1 | 4/2007 | Demolli | |
| 7,759,977 B1 | 7/2010 | Tsai et al. | |
| 2009/0206807 A1* | 8/2009 | Imura | ..................... G05F 1/573 |
| | | | 323/277 |
| 2010/0320980 A1 | 12/2010 | Terada et al. | |
| 2011/0121802 A1 | 5/2011 | Zhu | |
| 2012/0249104 A1* | 10/2012 | Heng | ..................... H02M 1/36 |
| | | | 323/282 |

OTHER PUBLICATIONS

The Extended search report issued by the Italian Patent and Trademark Office dated Jan. 27, 2016.

* cited by examiner

*Primary Examiner* — Nguyen Tran

(74) *Attorney, Agent, or Firm* — IP & T Group LLP

(57) ABSTRACT

A regulator includes a first operational amplifier configured to receive a reference voltage and a feedback voltage and to output a node voltage based on a difference of the feedback voltage and the reference voltage; a first switch unit configured to receive the node voltage and to supply a recover current based on the node voltage; an output unit configured to output an output voltage and the feedback voltage according to a supply of the recover current; a comparison unit configured to receive the reference voltage and a feedback voltage and to sense a voltage drop of the output voltage; and a second switch unit configured to discharge the first switch unit according to the difference of the reference voltage and the feedback voltage.

8 Claims, 4 Drawing Sheets

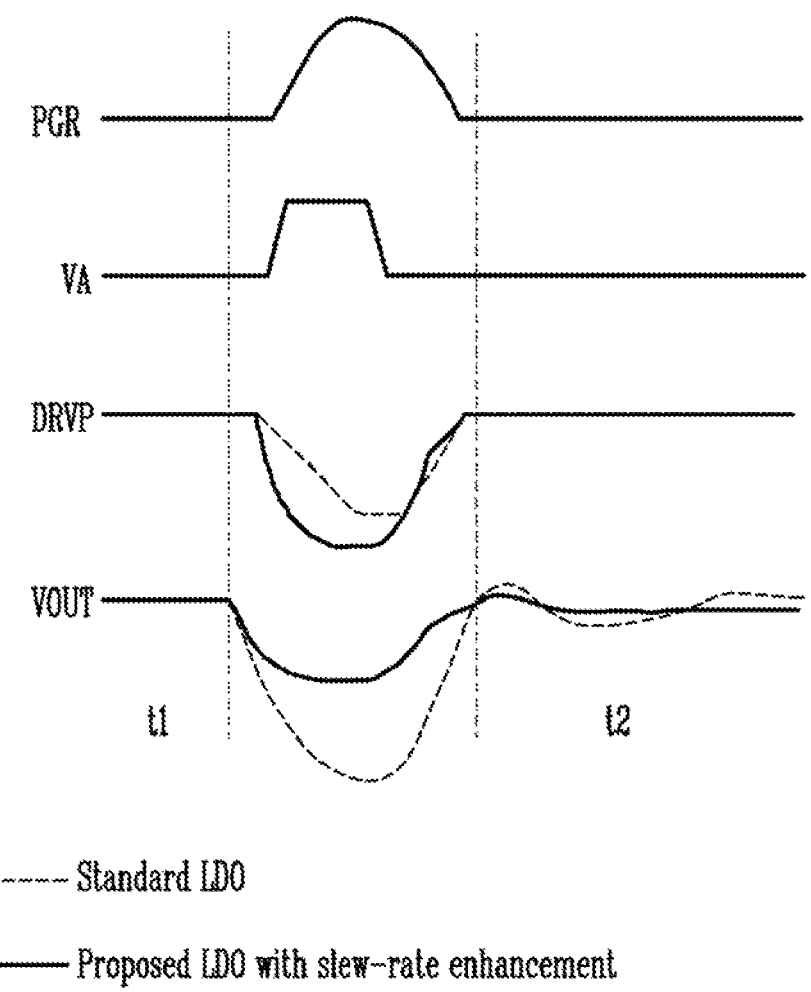

REGULATOR WITH ENHANCED SLEW RATE

CROSS-REFERENCE TO RELATED APPLICATION

The present application claims priority to Italian patent application No. 102015000018794 filed on May 28, 2015, which is incorporated herein by reference in its entirety.

BACKGROUND

1. Field

The present disclosure relates to a regulator with enhanced slew rate.

The disclosure particularly, but not exclusively, relates to a regulator with another feedback network therein.

2. Description of the Related Art

A low-dropout (LDO) regulator is a DC linear voltage regulator which may be regulate an output voltage even when a supply voltage is very close to, the output voltage. Advantages of the LDO regulator over other DC to DC regulators include lower switching noise, smaller device size, and greater design simplicity.

FIG. 1 schematically shows a circuit diagram of a conventional LDO regulator 100. The LDO regulator 100 includes an operational amplifier 10, a PMOS transistor PM, a first resistor R1, and a second resistor R2. The operational amplifier 10 receives a reference voltage VCCI_REF at its inverting input node and a feedback voltage FEED at its non-inverting input node. The feedback voltage FEED is a voltage at a feedback node FEED between the first resistor R1 and the second resistor R2. The gate of the PMOS transistor PM is coupled with an output node of the operational amplifier 10. A source of the PMOS transistor PM is coupled to a power voltage PWR. A drain of the PMOS transistor PM is coupled with one node of the first resistor R1 at an output node VOUT. One node of the second resistor R2 is coupled with the other node of the first resistor R1 at the feedback node FEED and the other node of the second resistor R2 is coupled with a ground voltage VSSI.

The LDO regulator 100 employs a negative feedback network to stabilize an output voltage VOUT. The LDO regulator 100 operates as explained below.

The node of the output voltage VOUT is coupled to a load. When a high current is required from the load instantaneously the output voltage VOUT may be drop from its desired voltage slightly. The drop of the output voltage VOUT causes a drop of the feedback voltage FEED which is provided to the non-inverting input node of the operational amplifier 10. Then, the output voltage DVRP of the operational amplifier 10 starts to drop because the output voltage DVRP is a gain proportional to the difference of the feedback voltage FEED and the reference voltage VCCI_REF. The drop of the output voltage DVRP of the operational amplifier 10 controls the PMOS transistor PM so that the PMOS transistor PM may be flow, from its source to drain, enough current to recover the feedback voltage FEED to its desired voltage.

For a sudden voltage drop of the LOD regulator, its voltage needs to be recovered rapidly in a memory circuit, for example, because the memory of cutting edge technology operates in a quite high bandwidth. Late recovery of the regulator's output voltage may cause a critical malfunction in the memory device during different operations of a memory device (e.g., read, program, erase, data in, data out, and so forth).

To obtain fast recovery in the LDO regulator, it is required that the operational amplifier has a high slew rate and a high bandwidth. However, the high slew rate and bandwidth will increase current consumption. Moreover, there is a trade-off between gain and bandwidth, thus increasing bandwidth of the operational amplifier may reduce the gain of it. High gain of the operational amplifier 10 is necessary to sense a small amount of voltage, drop.

It is needed to devise an improved LDO regulator capable of operating with high slew rate without much current consumption increase.

SUMMARY

Embodiments of the invention are directed to a regulator having a negative feedback network with improved slew rate and bandwidth and with reduced current and power consumption during the recovery of an output voltage.

In an embodiment of the invention, a regulator includes a first operational amplifier configured to receive a reference voltage at its inverting input node and a feedback voltage at its non-inverting input node and to output a node voltage based on a difference of the feedback voltage and the reference voltage; a first switch unit configured to receive the node voltage and to supply a recover current based on the node voltage; an output unit configured to output an output voltage and the feedback voltage according to a supply of the recover current; a comparison unit configured to receive the reference voltage at its non-inverting input node and a feedback voltage at its inverting input node and to sense a voltage drop of the output voltage; and a second switch unit configured to discharge the first switch unit according to the difference of the reference voltage and the feedback voltage, wherein the comparison unit comprises: a second operational amplifier configured to receive the reference voltage at its non-inverting input node and the feedback voltage at its inverting input node; and a downshifter configured to downshift an output voltage of the second operational amplifier and to provide the downshifted voltage to the second switch unit.

In an embodiment of the invention, a regulator comprises a first operational amplifier suitable for receiving a reference voltage at its inverting input node and a feedback voltage at its non-inverting input node; a PMOS transistor coupled with an output node of the first operational amplifier at its gate; a second operational amplifier for receiving the reference voltage at its non-inverting input node and the feedback voltage at its inverting input node; a first resistor coupled with a drain of the PMOS transistor at its first node; a second resistor coupled with a second node of the first resistor at its first node, and grounded at its second node, wherein the feedback voltage is of the first node of the second resistor; and a first NMOS transistor coupled with the gate of the PMOS transistor at its drain, and grounded at its source, wherein the gate of the PMOS transistor is discharged according to an output voltage of the comparison unit, and the output voltage of the comparison unit is determined based on difference of the reference voltage and the feedback voltage, and wherein the second operational amplifier provides its output voltage to a gate of the first NMOS transistor.

BRIEF DESCRIPTION OF THE DRAWINGS

The characteristics and advantages of the present invention will become apparent from the following description of embodiments thereof given by way of indicative and non-limiting example with reference to the annexed drawings in which:

FIG. 5 schematically shows a timing diagram of the LDO regulator with an exemplary circuit configuration of the first operational amplifier of FIG. 4.

DETAILED DESCRIPTION

Figure 1:
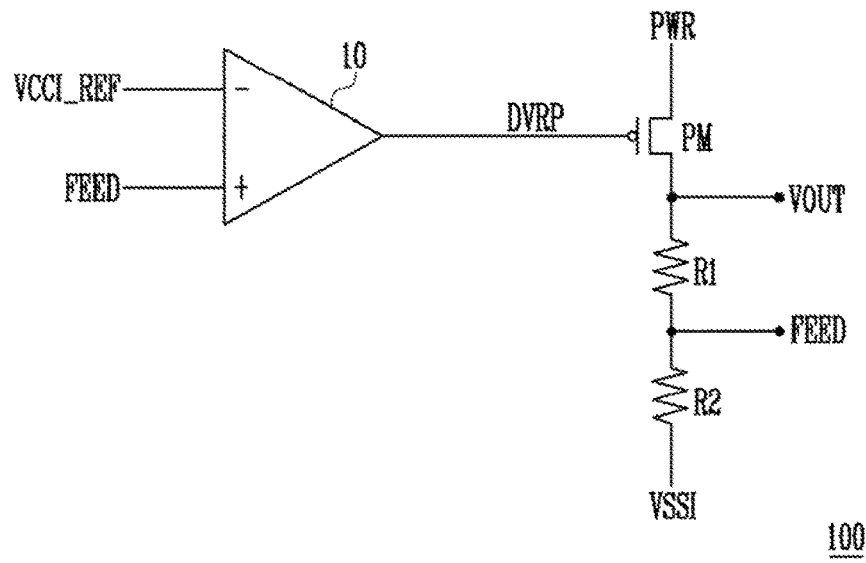
FIG. 1 schematically shows a circuit diagram of a conventional LDO regulator.

Exemplary embodiments of the present invention will be described in detail below with reference to the accompanying drawings. While the present invention is shown and described in connection with exemplary embodiments thereof, it will be apparent to those skilled in the art that various modifications may be made without departing from the spirit and scope of the invention. The terms and words used in the specification and claims should not be construed according to their ordinary or dictionary meaning. On the basis of the principle that the inventor may be define the appropriate meaning of a term in order to describe his/her own invention in the best possible way, a term should be construed according to a meaning that complies with the technical concept of the present invention. We also note that, detailed descriptions of well-known constructions in the relevant art may be omitted to avoid unnecessarily obscuring the present invention.

In the drawings corresponding features are identified by the same reference numerals.

Figure 2:
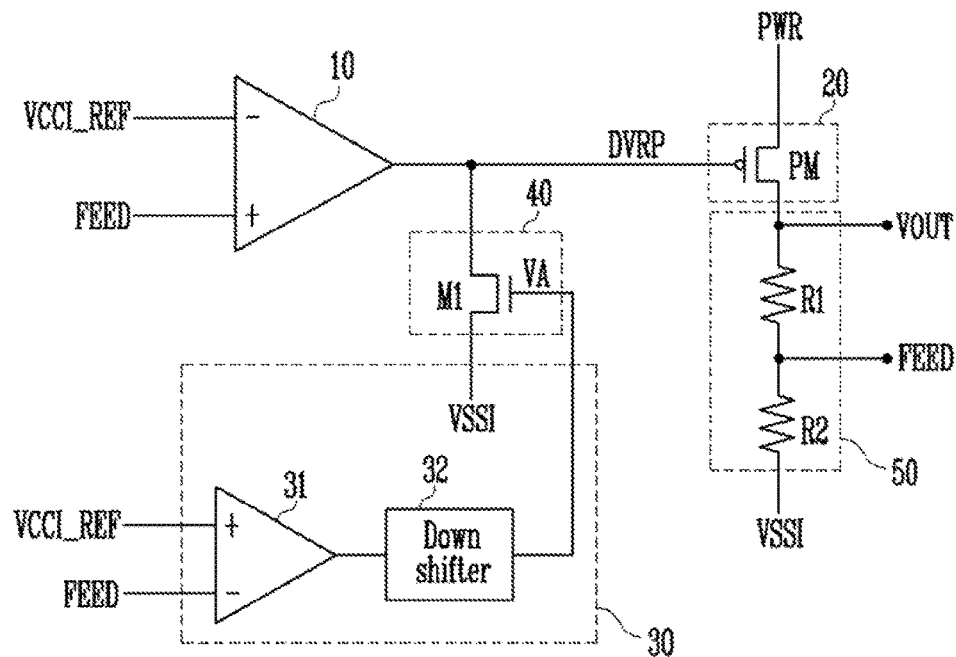
FIG. 2 schematically shows a circuit diagram of a LDO regulator, according to an embodiment of the present invention.

FIG. 2 schematically shows a circuit diagram of a low-dropout (LDO) regulator 200 according to an embodiment of the present invention.

The LDO regulator 200 includes a first operational amplifier 10, a first switch unit 20, second switch unit 30 and an output unit 40. The first switch unit 20 comprises a PMOS transistor PM. The second switch unit 30 comprises a first NMOS transistor M1. The output unit comprises a first resistor R1 and a second resistor R2. The first operational amplifier 10 receives a reference voltage VCCI_REF at its inverting input node and a feedback voltage FEED at its non-inverting input node. The feedback voltage FEED is a voltage at a feedback node FEED between the first resistor R1 and the second resistor R2. A gate of the PMOS transistor PM is coupled with an output node of the first operational amplifier 10. A source of the PMOS transistor PM is coupled to a power voltage PWR. A drain of the PMOS transistor PM is coupled with one node of the first resistor R1 at an output node VOUT. One node of the second resistor R2 is coupled with the other node of the first resistor R1 at the feedback node FEED and the other node of the second resistor R2 is coupled with a ground voltage VSSI.

The LDO regulator 200 further includes a first NMOS transistor M1. A drain of the first NMOS transistor M1 is coupled with the gate of PMOS transistor PM. A source of the NMOS transistor M1 is coupled with the ground voltage VSSI.

The LDO regulator 200 further includes a comparison unit 30, The comparison unit 30 receives the reference voltage VCCI_REF and the feedback voltage FEED as its inputs. Then, an output voltage VA of the comparison unit 30 is provided to a gate of the first NMOS transistor M1. The output voltage VA of the comparison unit 30 is generated based on the difference of the reference voltage VCCI_REF and the feedback voltage FEED. In this way, the comparison unit 30 performs a sensing of the voltage drop at the output of the LDO regulator 200. The gate voltage of the first NMOS transistor M1 is controlled so that a small change of the difference between the reference voltage VCCI_REF and the feedback voltage FEED may switch on the first NMOS transistor M1 to discharge the gate of the PMOS transistor PM.

The comparison unit 30 may include a second operational amplifier 31 and a downshifter 32. The second operational amplifier may receive the reference voltage VCCI_REF at its non-inverting input node and the feedback voltage FEED at its inverting input node. The downshifter 32 may downshift an output voltage of the second operational amplifier 31, and provide the downshifted voltage VA to the gate of the first NMOS transistor M1.

When there is a drop of the output voltage VOUT due to a high current load, the feedback voltage FEED at the feedback node FEED between the first resistor R1 and the second resistor R2 also drops. The drop of the feedback voltage FEED causes the difference between the reference voltage VCCI_REF and the feedback voltage FEED to increase. The output of the second operational amplifier 31 is proportional to this difference between the reference voltage VCCI_REF and the feedback voltage FEED. Then, higher output voltage is provided to the downshifter 32, which, in turns, raises the voltage VA of the gate of the first NMOS transistor M1. When the gate voltage VA exceeds the threshold voltage Vth of the first NMOS transistor M1, the first NMOS transistor M1 turns on, and starts to discharge current from the gate of the PMOS transistor PM. Due to the discharge, the voltage of the gate of the PMOS transistor PM drops rapidly, which causes the source-gate voltage of the PMOS transistor PM to increase. The increased source-gate voltage of the PMOS transistor PM results in the increase of the drain-source current of the PMOS transistor PM, which in turn compensates the drop of the output voltage VOUT, as desired.

In the embodiment, the comparison unit 30 and the first NMOS transistor M1 serve as rapid switching circuitry to pull down the gate voltage of the PMOS transistor PM. Usually, the first operational amplifier 10 requires high gain because it should be able to sense a small voltage fluctuation between the reference voltage VCCI_REF and the feedback voltage FEED, and the output of the first operational amplifier 10 operates at almost near the power voltage PWR which is quite high. Due to the trade-off between the gain and bandwidth, the first operational amplifier 10 would become more complicated and occupy more area when the first operational amplifier 10 is designed to have a higher bandwidth. Moreover, this complicated design could further increase the consumption of the current.

Instead of modifying the first operational amplifier 10, the embodiment employs a feedback network including the comparison unit 30 and the first NMOS transistor M1. The second operational amplifier 31 does not need a high gain because it switches on and off the first NMOS transistor M1 by making the gate voltage VA to exceed the threshold voltage Vth. The threshold voltage Vth is usually small. Therefore, the bandwidth of the second operational amplifier 31 may be increased in a given gain bandwidth product, due to its low gain. The first NMOS transistor M1 may be operating, i.e., switch on-and-off, faster than a usual operational amplifier. The additional feedback network (the comparison unit 30 with the first NMOS transistor M1) may be thus increase the slew rate of the LDO regulator 200. Moreover, the additional feedback network does not require complicated configuration, and the area occupied by the additional feedback network may be minimized. This may be advantageous for an up-to-date memory device where conductive lines are densely populated.

In an alternative example, the output of the second operational amplifier 31 may be provided directly to the gate of the first NMOS transistor M1 without using the downshifter 32.

Figure 3:
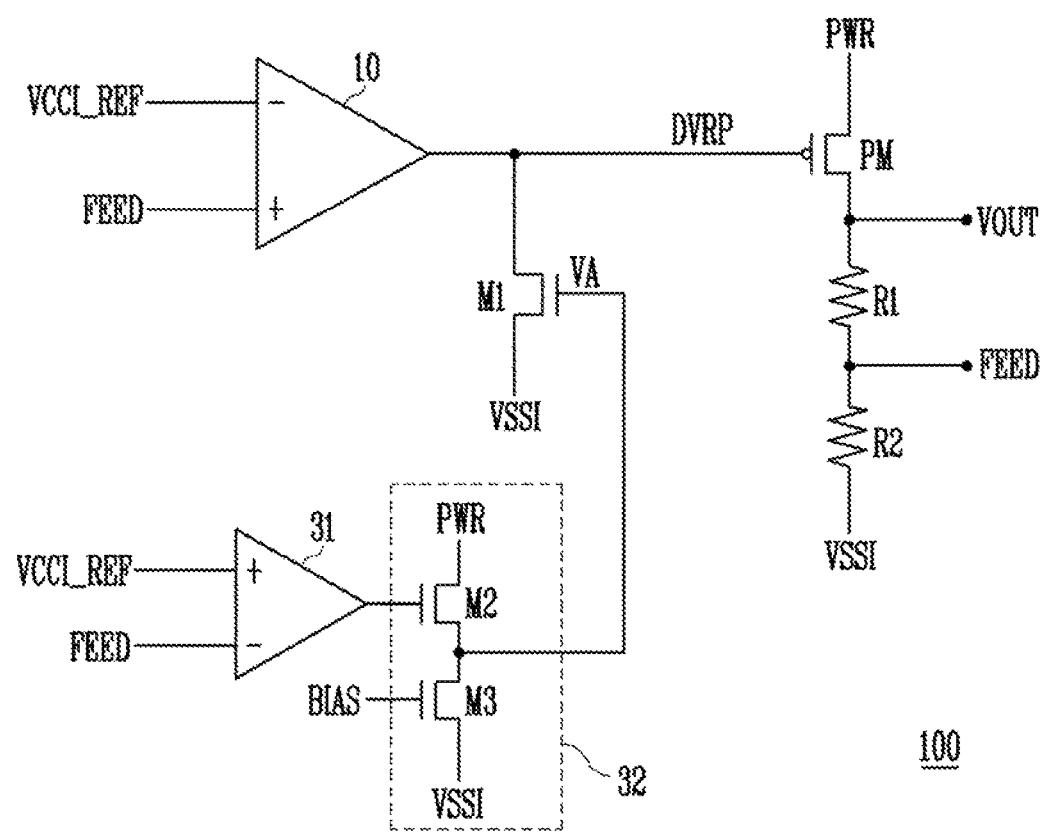
FIG. 3 schematically shows the circuit diagram of the LDO regulator with an exemplary downshifter.

FIG. 3 schematically shows a circuit diagram of the LDO regulator 200 with an exemplary downshifter.

According to the example of FIG. 3, the downshifter 32 may include a second NMOS transistor M2 and a third NMOS transistor M3. A source of the second NMOS transistor M2 is coupled with a drain of the third NMOS transistor M3. A source of the third NMOS transistor M3 is coupled to the ground voltage VSSI. The output node of the second operational amplifier 31 is coupled with a gate of the second NMOS transistor M2. A node between the second NMOS transistor M2 and the third NMOS transistor M3 is coupled with the gate of the first NMOS transistor M1. A gate of the third NMOS transistor M3 is provided with a bias voltage BIAS.

The third NMOS transistor M3 serves as a biasing transistor. The bias voltage BIAS may be controlled so that the output voltage VA may move within a desired voltage range. The downshifter 30 may be regarded as a common-drain amplifier with a gain of less than 1.

Since the threshold voltage of the first NMOS transistor M1 is usually low compared to the highest output voltage of the second operational amplifier 31, the output voltage of the second operational amplifier 31 needs to be adapted to the threshold voltage Vth. When supposing that the second operational amplifier 31 is coupled directly with the first NMOS transistor M1, the first NMOS transistor M1 may be even be turned on even by a slight fluctuation of the output voltages of the second operational amplifier 31 caused by a noise in the inputs. The downshifter 32 prevents this situation and the LDO regulator 200 of becoming unstable due to the action of the first NMOS transistor M1 in the case when there is no voltage drop at the output node VOUT. In absence of the downshifter 32, the first NMOS transistor M1 would in fact act on the output node VOUT by discharging it and thus the PMOS transistor PM would inject some charges onto the output node VOUT, leading the LDO regulator 200 out of the regulated area.

Figure 4:
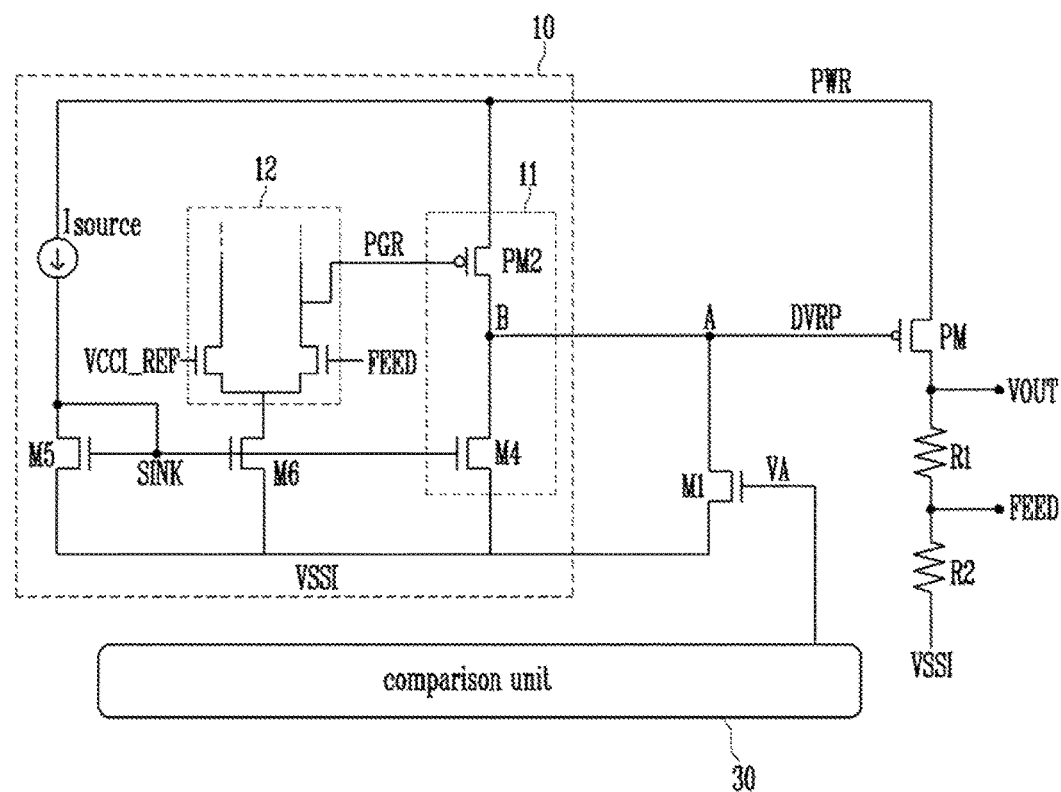
FIG. 4 schematically shows a circuit diagram of the LDO regulator with an exemplary circuit configuration of a first operational amplifier.

FIG. 4 schematically shows a circuit diagram of the LDO regulator with an exemplary circuit configuration of the first operational amplifier 10.

The exemplary first operational amplifier 10 includes a current mirror including three NMOS transistors M5, M6 and M4 linked together at their gates, a differential input stage 12, and an output stage 11. The output stage 11 includes a second PMOS transistor PM2 and a fourth NMOS transistor M4. The drain of the second PMOS transistor PM2 is coupled with a drain of the fourth NMOS transistor M4 at node B. The node B is coupled with node A which is, in turn, coupled with the gate of the first PMOS transistor PM. A gate of the fourth NMOS transistor M4 is coupled with gates of the fifth and sixth NMOS transistors M5 and M6 transistors serving as the current mirror.

When supposing that the LDO regulator 200 of the embodiment did not include the first NMOS transistor M1 and the comparison unit 30 forming another negative feedback block, the voltage at the gate of the first PMOS transistor PM will be discharged to the ground voltage through the fourth NMOS transistor M4, when there is a voltage drop in the feedback voltage FEED. The gate voltage of the fourth NMOS transistor M4 is determined according to the current source Isource because of the three NMOS transistors M4, M5 and M6, linked together at their gates to form the current mirror. Therefore, the gate voltage of the fourth NMOS transistor M4 does not respond adaptively to the voltage difference of the reference voltage VCCI_REF and the feedback voltage FEED. The current of the fourth NMOS transistor M4 is constant and given by the ratio of the current mirror (to the left in the first operational amplifier 10 of FIG. 4). In order to increase the discharge current of the node B, the biasing current of the fourth NMOS transistor M4 should be also raised; the fourth NMOS transistor M4 would thus, have a not null consumption with or without a voltage drop of the output node VOUT. When a drop occurs, the second PMOS transistor PM2 turns off and the fourth NMOS transistor M4 discharges node B with a current which is almost constant.

According to an embodiment of the invention, the biasing current of the fourth NMOS transistor M4 may be reduced, thus reducing the DC consumption of the LDO regulator 200 as a whole. In this case, the discharge of the node DVRP is assured by the first NMOS transistor M1, which correctly acts in case of a voltage drop. The consumption of the first NMOS transistor M1 is null instead in case of no voltage drop of the output node VOUT. More particularly, the first NMOS transistor M1 is ON only when there is a voltage drop of the output node VOUT, being otherwise in the OFF state.

FIG. 5 schematically shows a timing diagram of the LDO regulator 200 with an exemplary circuit configuration of the first operational amplifier 10 in FIG. 4. A comparison with a standard LDO regulator is also indicated.

At t1, the drop of the output voltage VOUT occurs, and the comparison unit 30, after sensing the voltage difference between the feedback voltage FEED and the reference voltage VCCI_REF, outputs a higher voltage to the gate VA of the first NMOS transistor M1. This, then, turns on the first NMOS transistor M1, and drops the gate voltage DVRP of the PMOS transistor PM. Due to the drop of the gate voltage DVRP, the PMOS transistor PM flows more current to the load until the output voltage VOUT may be recover its desired voltage at t2.

The slew rate and the bandwidth of the aforementioned LDO regulator having another negative feedback network may be thus improved. Moreover, the current and power consumption during the recovery of the output voltage may be reduced.

From the foregoing it will be appreciated that although specific embodiments of the invention have been described herein for purposes of illustration, various modifications may be made without deviating from the spirit and scope of the invention as defined by the appended claims.

What is claimed is:

1. A regulator comprising:
    a first operational amplifier configured to receive a reference voltage at its inverting input node and a feedback voltage at its non-inverting input node and to output a node voltage based on a difference of the feedback voltage and the reference voltage;
    a first switch unit configured to receive the node voltage and to supply a recover current based on the node voltage;

an output unit configured to output an output voltage and the feedback voltage according to a supply of the recover current;

a comparison unit configured to receive the reference voltage at its non-inverting input node and a feedback voltage at its inverting input node and to sense a voltage drop of the output voltage; and a second switch unit configured to discharge the first switch unit according to the difference of the reference voltage and the feedback voltage, wherein the comparison unit comprises:

a second operational amplifier configured to receive the reference voltage at its non-inverting input node and the feedback voltage at its inverting input node; and a downshifter configured to downshift an output voltage of the second operational amplifier and to provide the downshifted voltage to the second switch unit, wherein the downshifter comprises a second NMOS transistor and a third NMOS transistor, wherein a source of the second NMOS transistor is coupled with a drain of the third NMOS transistor, and a source of the third NMOS transistor is grounded, wherein the output node of the second operational amplifier is coupled with a gate of the second NMOS transistor, and a node between the second NMOS transistor and the third NMOS transistor is coupled with the second switch unit, and wherein the third NMOS transistor is controlled by a bias voltage to control the node between the second NMOS transistor and the third NMOS transistor to have a voltage level corresponding to a threshold voltage of the second switch unit.

2. The regulator of claim 1, wherein the first switch unit comprises a PMOS transistor coupled with an output node of the first operational amplifier at its gate.

3. The regulator of claim 2, wherein the output unit comprises:

a first resistor coupled with a drain of the PMOS transistor at its first node; and a second resistor coupled between a second node of the first transistor and a ground voltage, wherein the output voltage is a voltage at the first node of the first resistor, and the feedback voltage is a voltage is a voltage at the second node of the first resistor.

4. The regulator of claim 2, wherein the second switch unit comprises a first NMOS transistor coupled with the gate of the PMOS transistor at its drain and grounded at its source.

5. The regulator of claim 2, the gate of the PMOS transistor is discharged according to an output voltage of the comparison unit, and the output voltage of the comparison unit is determined based on the difference of the reference voltage and the feedback voltage.

6. The regulator of claim 1, wherein the downshifter is a common-drain amplifier.

7. The regulator of claim 4, wherein the node between the second NMOS transistor and the third NMOS transistor is coupled with the gate of the first NMOS transistor.

8. The regulator of claim 1, wherein a gate of the third NMOS transistor is provided with a voltage for biasing the downshifter.

* * * * *